United States Patent [19]
Okada et al.

[11] Patent Number: 5,408,477
[45] Date of Patent: Apr. 18, 1995

[54] ERROR CORRECTION METHOD

[75] Inventors: Takashi Okada; Kazuhiro Yasuda; Kazutoshi Shimizume, all of Kanagawa, Japan

[73] Assignee: Sony Corporation, Tokyo, Japan

[21] Appl. No.: 806,161

[22] Filed: Dec. 12, 1991

[30] Foreign Application Priority Data

Dec. 21, 1990 [JP] Japan ................... 2-413508

[51] Int. Cl.⁶ .................... G06F 11/10; H03M 13/00
[52] U.S. Cl. .................... 371/37.4; 371/39.1
[58] Field of Search ............ 371/37.4, 37.5, 37.1, 371/40.3, 39.1, 40.1

[56] References Cited

U.S. PATENT DOCUMENTS

| Re. 33,462 | 11/1990 | Suzuki et al. | 371/37.5 |
| 4,541,092 | 9/1985 | Sako et al. | 371/40.3 |
| 4,546,474 | 10/1985 | Sako et al. | 371/40.3 |
| 5,060,221 | 10/1991 | Sako et al. | 371/37.4 |

Primary Examiner—Robert W. Beausoliel, Jr.
Assistant Examiner—Joseph E. Palys
Attorney, Agent, or Firm—Charles P. Sammut; Limbach & Limbach

[57] ABSTRACT

Q- or P-sequence error correction is suitable for correcting errors of data stored in a CD-ROM. Errors of data are corrected using a 2-word parity code added to the data and input pointers that have been set for the words that are presumed to be subjected to errors. Output pointers are set for respective words of data which are presumed not to be error-corrected completely.

10 Claims, 7 Drawing Sheets

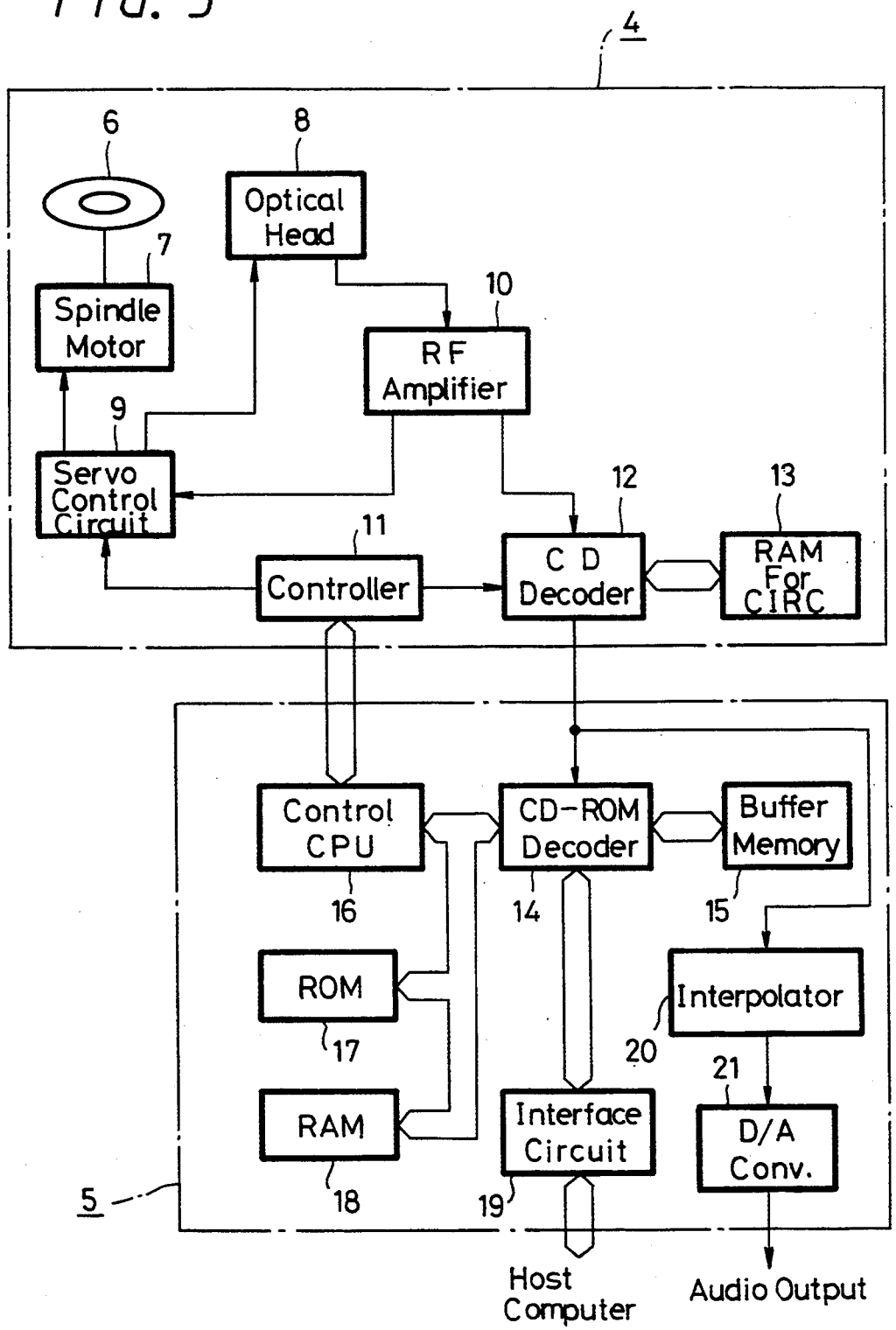

5,408,477

ERROR CORRECTION METHOD

BACKGROUND OF THE INVENTION

1. Field of the Invention

The present invention relates to an error correction method for effecting Q- or P-sequence error correction on data stored in a CD-ROM.

2. Description of the Prior Art

CD-ROMs store digital data on compact disks (CD) that can be played back by CD players. The CD-ROMs are required to have a bit error rate of $10^{-12}$ or below as with other computer devices. Generally, the bit error rate of CDs themselves is about $10^{-9}$. Therefore, in addition to the error correction capability of CDs, CD-ROMs have another error correction code that is complete in each block composed of 98 frames of the CD. The other error correction code of the CD-ROMs is a product code of P and Q sequences.

FIG. 1 of the accompanying drawings shows the format of one block of data stored in a CD-ROM. In FIG. 1 one block comprises 2352 bytes (bytes are indicated by B) of data including, successively from the leading end, a synchronizing pattern of 12 bytes, a header of 4 bytes indicating an absolute time and a mode, user data of 2048 bytes, a CRC (cyclic redundancy check) code, a pattern of zeros of 8 bytes, P-sequence parity (P parity) check data of 172 bytes, and Q-sequence parity (Q parity) check data of 104 bytes. The 4-byte CRC code is used to finally check whether the data have errors or not, after the reproduced data have been subjected to P- and Q-sequence error correction. The CRC code is effective with respect to the data of 2064 bytes that include the synchronizing pattern, the header, and the user data.

The data format shown in FIG. 1 is a format for the mode 1. For the mode 2, the pattern of zeros of 8 bytes is dispensed with, and a subheader of 8 bytes is inserted between the header and the user data.

From the data of 2352 bytes shown in FIG. 1, the synchronizing pattern of 12 bytes is removed, and the remaining data of 2340 bytes are divided into two data groups each of 1170 bytes. One of the data groups as it is interleaved is shown in FIG. 2. In FIG. 2, the bytes of data are designated by D0, D1, ..., D1169 successively from the leading end of the data group. The user data D0 through D1031 are arranged in 24 rows and 43 columns, the P parity data D1032 through D1117 in 2 rows and 43 columns, and the Q parity data D1118 in 2 rows and 26 columns. The P sequence is a sequence in each of the 43 columns, and the Q sequence is a sequence diagonally across the matrix of 26 rows×43 columns. More specifically, 2 bytes of P parity are added to the user data of 24 bytes in each of the 43 columns, and 2 bytes of Q parity are added to the diagonal data of 43 bytes (including the 2 bytes of P parity).

It is assumed that one word is represented by m bits, overall data by n words, user data except parity data by k words, and a Reed-Solomon code defined on a Galois field $GF(2^m)$ with the minimum distance d in an error-free condition is a (m, n, k, d) code. In CD-ROMs, one word is represented by one byte, the P sequence by a (8, 26, 24, 3) code having two words of parity, and the Q sequence by a (8, 45, 43, 3) code having two words of parity. The error correction code for CD-ROMs is a product code of the Reed-Solomon code defined on the Galois field $GF(2^8)$. If there are two words of parity, then one word of error can accurately be corrected, and two words of error can also accurately be corrected provided the position of the error is known from a pointer.

One block of data in a CD-ROM, as shown in FIG. 1, corresponds to 98 frames of data each of 24 bytes in a CD. When one block of data is recorded in a CD-ROM, a CIRC (cross interleave Reed Solomon code) composed of a C1-sequence Reed-Solomon code and a C2-sequence Reed-Solomon code that are coupled by interleaving is added to the data. FIG. 3 shows the manner in which such a CIRC as an error correction code for CDs is encoded. As shown in FIG. 3, each of data groups 1 of 24 words (=24 bytes) is scrambled, and then 4 words of C2-sequence parity are added to each data group of 24 words, forming a data group 2. After the data of each data group 2 of 28 words is interleaved, 4 words of C1-sequence parity are added to each data group of 28 words, forming a data group 3. For details of product codes for CDs themselves, reference should be made to Japanese Laid-Open Patent Publications Nos. 57-4629 and 57-6417.

The C2 sequence is a Reed-Solomon code of (m=8, n=28, k=24, d=5), and the C1 sequence is a Reed-Solomon code of (m=8, n=32, k=28, n=5). Even if no pointer is used, a 2-word random error with respect to each data of 32 words can be corrected with the C1-sequence parity code, and a 2-word random error with respect to each data of 28 words can be corrected with the C2-sequence parity code. If any data remain that cannot finally be corrected with the C1- and C2-sequence error correction codes, then a pointer indicating that the data are presumed to be incorrect is set with respect to the data.

An overall sequence of error correction for the data in a CD-ROM will be described below with reference to FIG. 4. A product code of C1 and C2 sequences of a CD itself is added to each block of data shown in FIG. 1, and a signal produced by modulating the resultant data according to EFM or the like is recorded in the CD-ROM. In a reproducing system for the CD-ROM, data corresponding to CD frames are successively read from the CD-ROM, and demodulated in a step 100. After the read data are shuffled, the data of each frame of 32 words are subjected to the C1-sequence error correction for CDs, producing data of 28 words in a step 101.

If the 32 words contain an error of 3 words or more, then it is impossible to correct the error completely. If the error correction is not complete, then a C1 pointer is set which indicates that the data of each frame of 32 words is presumed to be incorrect, i.e., the C1 pointer is set to a high level of "1" with respect to the data of each frame of 28 words in a step 102. Actually, it has been proposed to set the C1 pointer for all the data for safety reason in the event that a 2-word error is corrected according to the C1-sequence error correction. However, since the data with respect to which the C1 pointer has been set contain correct data, the C1 pointer may be considered as indicating data which may possibly contain an error.

Thereafter, one word of data is extracted from every five frames of the 108 frames of data which have been decoded according to the C1 sequence, and the C2-sequence error correction is effected on the extracted 28 words of data in a step 103. According to the C2 sequence, 4 words of the 28 words of data are parity words, and the C1 pointer has been added indicating whether the data of each of the 28 words is in error or not. Therefore, a 4-word error can be corrected from a theoretical standpoint. However, even when the C2-sequence error correction is carried out, the error correction may not completely be effected on the 24 words except the parity words. In the event that the error correction is not completely effected on the 24 words, a C2 pointer is set which indicates that each of the 24 words of data is presumed to be incorrect, i.e., the C2 pointer is set to a high level of "1" with respect to each of the 24 words of data in a step 104. The C1 pointer that has been supplied from the previous stage may be reproduced as the C2 pointer.

The decoder which has effected the error correction on the CD data supplies, in a step 105, the CD-ROM decoder with 2352 (=24×94) words of data, which have been subjected to the error correction, of one block of the CD-ROM corresponding to 98 frames of the CD, and the C2 pointers of 2352 bits indicating of whether the respective words are in error or not. The CD-ROM decoder effects Q-sequence error correction on 45 words (2 words thereof are parity words) of data of the Q sequence shown in FIG. 2 in a step 106, and sets a pointer to a high level of "1" with respect to those words which are presumed not to be error-corrected completely in a step 107.

Thereafter, the CD-ROM decoder effects P-sequence error correction on 26 words (2 words thereof are parity words) of data of the P sequence shown in FIG. 2 in a step 108, and sets a pointer to a high level of "1"0 with respect to those words which are presumed not to be error-corrected completely in a step 109. In a step 110, errors are detected from the synchronizing pattern, the header, and the user data using the CRC code. Thereafter, the CD-ROM decoder supplies a host computer with the error-corrected data, the pointers added to the data, and the result of error detection using the CRC code in a step 111. Then, next data are read in a step 112.

Since the product code of P and Q sequences is added to the usual CD error correction code, the data stored in the CD-ROMs are highly reliable as the bit error rate thereof is $10^{-12}$ or less.

Recently, however, there is a demand for higher reliability of CD-ROM data. To achieve higher reliability means to reduce the probability of erroneous correction and the probability of correction failures. In addition, there is also a demand for the real-time reproduction of data from CD-ROMs while effecting error correction on the data at high speed.

Heretofore, the P- and Q-sequence error correction has been effected on CD-ROM data by carrying out complex calculations based on software. The conventional process is not suitable for relatively small systems to increase the speed of the error correction procedure.

OBJECTS AND SUMMARY OF THE INVENTION

It is an object of the present invention to provide an error correction method capable of effecting error correction on words presumed to be subjected to an error, highly reliably and at high speed using a 2-word parity code and input pointers that have been set with respect to the respective words.

Another object of the present invention is to provide an error correction method of effecting error correction on $(N-2)$ words (N is an integer of 3 or more) of data using a 2-word parity code added to the data and input pointers that have been set with respect to the data presumed to be subjected to an error, and also of generating output pointers to be set with respect to words of data which are presumed not to be error-corrected completely, according to steps (a) through (d) below with respect to a first aspect and as shown in FIGS. 6A and 6B.

Still another object of the present invention is to provide an error correction method of effecting error correction on $(M-2)$ words (M is an integer of 3 or more) of data using a 2-word parity code added to the data and input pointers that have been set with respect to the data presumed to be subjected to an error, and also of generating output pointers to be set with respect to words of data which are presumed not to be error-corrected completely, according to steps (a) through (d) below with respect to a second aspect and as shown in FIGS. 7A and 7B.

According to a first aspect of the present invention, there is provided a method of effecting error correction on $(N-2)$ words (N is an integer of 3 or more) of data using a 2-word parity code added to the data and input pointers that have been set with respect to the data presumed to be subjected to an error, and also of generating output pointers to be set with respect to words of data which are presumed not to be error-corrected completely, said method comprising the steps of:

(a) determining 2-word syndromes from the $(N-2)$ words of data and the 2-word parity code, and calculating an error position i from the 2-word syndromes;

(b) if the error position i is $(N-1)$ or less and the input pointer is set in the error position i, reproducing the input pointers as the output pointers when the input pointers are set in the positions of other two words or more, and correcting one word in the error position i when the input pointer is set in the position of other one word or less;

(c) if the error position i is $(N-1)$ or less and the input pointer is not set in the error position i, reproducing the input pointers as the output pointers when the input pointers are set in the positions of other two words or more, setting the output pointers with respect to all the data when the input pointer is set in the position of other one word, and correcting one word in the error position i when the input pointer is not set for other words; and (d) if the error position i is N or more, reproducing the input pointers as the output pointers when the input pointers are set in the positions of two words or more, and setting the output pointers with respect to all the data when the input pointer is set in the position of one word or less.

According to a second aspect of the present invention, there is also provided a method of effecting error correction on $(M-2)$ words (M is an integer of 3 or more) of data using a 2-word parity code added to the data and input pointers that have been set with respect to the data presumed to be subjected to an error, and also of generating output pointers to be set with respect to words of data which are presumed not to be error-corrected completely, the method comprising the steps of:

(a) determining 2-word syndromes from the $(M-2)$ words of data and the 2-word parity code, and calculating an error position j from the 2-word syndromes;

(b) if the error position i is $(M-1)$ or less and the input pointer is set in the error position j, reproducing the input pointers as the output pointers when the input pointers are set in the positions of other three words or more, correcting two words for which the input pointers are set when the input pointers are set in the positions of other two words, and correcting one word in the error position j when the input pointer is set in the position of other one word or less;

(c) if the error position i is (M−1) or less and the input pointer is not set in the error position j, reproducing the input pointers as the output pointers when the input pointers are set in the positions of other three words or more, correcting two words for which the input pointers are set when the input pointers are set in the positions of other two words, setting the output pointers with respect to all the data when the input pointer is set in the position of other one word, and correcting one word in the error position j when the input pointer is not set for other words; and (d) if the error position j is M or more, reproducing the input pointers as the output pointers when the input pointers are set in the positions of three words or more, correcting two words for which the input pointers are set when the input pointers are set in the positions of other two words, and setting the output pointers with respect to all the data when the input pointer is set in the position of one word or less.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIG. 5 is a block diagram of a reproducing system for CD-ROMs;

DETAILED DESCRIPTION OF THE PREFERRED EMBODIMENTS

Figure 1:
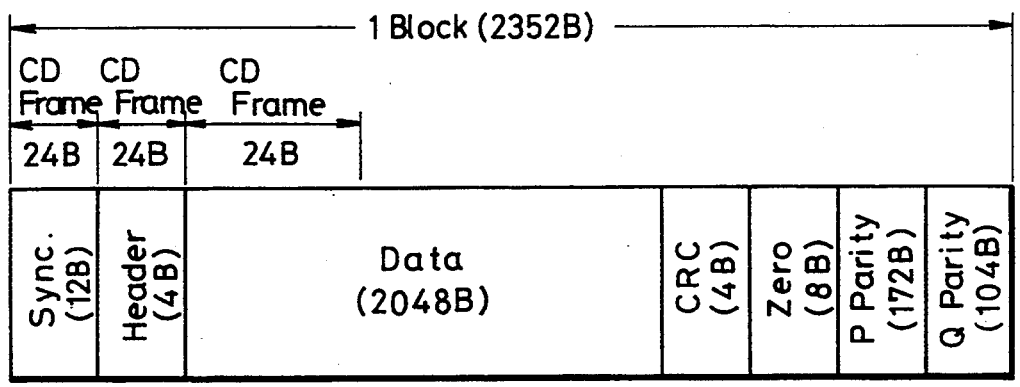
FIG. 1 is a diagram showing a format of one block of data stored in a conventional CD-ROM.

Error correction methods according to preferred embodiments of the present invention will be described below with reference to FIGS. 5, 6, and 7. The principles of the present invention are particularly useful when embodied in error correction methods for CD-ROMs. Prior to describing the error correction methods according to the present invention, a reproducing system for CD-ROMs, with respect to which the error correction methods are to be carried out, will be described below.

FIG. 5 shows a reproducing system for CD-ROMs. The reproducing system generally comprises a CD player 4 and a decoder 5 for CD-ROMs. The CD player 4 comprises a spindle motor 7 for rotating a compact disk 6, an optical head 8, and a servo control circuit 9 for controlling operation of the spindle motor 7 and the optical head 8. A reproduced signal RF from the optical head 8 is supplied through an RF amplifier 10 to the servo control circuit 9 and a CD decoder 12. The CD decoder 12 demodulates the reproduced signal, which has been modulated according to EFM, and effects error correction on the CD data using CIRC composed of C1 and C2 codes. The CD decoder 12 sets a C2 pointer to "1" with respect to those data which are presumed not to be error-corrected. The CD player 4 also includes a controller 11 for synchronizing the servo control circuit 9 and the CD decoder 12 in operation, and a RAM 13 for storing the CIRC.

The decoder 5 for CD-ROMs comprises a CD-ROM decoder 14 that is supplied with intermediate data DA composed of the error-corrected data and the C2 pointer from the CD decoder 12. The CD-ROM decoder 14 effects error correction on the data contained in the intermediate data DA using the C2 pointer and the P- and Q-sequence parity data shown in FIG. 1, sets a pointer to "1" with respect to those data which are presumed not to have been error-corrected, and finally detects errors using a CRC code. After the error correction, the data, the pointer information, and the result of error detection using the CRC code are supplied through an interface 19 to an external host computer.

The decoder 5 also comprises a buffer memory 15 for the CD-ROM decoder 14, a control CPU 16 for synchronizing the controller 11 of the CD player 4 and the CD-ROM decoder 14 in operation, a ROM 17, a RAM 18, an interpolator 20, and a digital-to-analog (D/A) converter 21. The intermediate data DA from the CD decoder 12 are supplied through the interpolator 20 and the D/A converter 21 to an audio output terminal (not shown). If the data recorded on the disk 6 represent audio signals, then the interpolator 20 interpolates the data with respect to which the C1 pointer has been set, using preceding and following normal data, so that audio signals with less noise can be produced from the audio output terminal.

Figure 4:
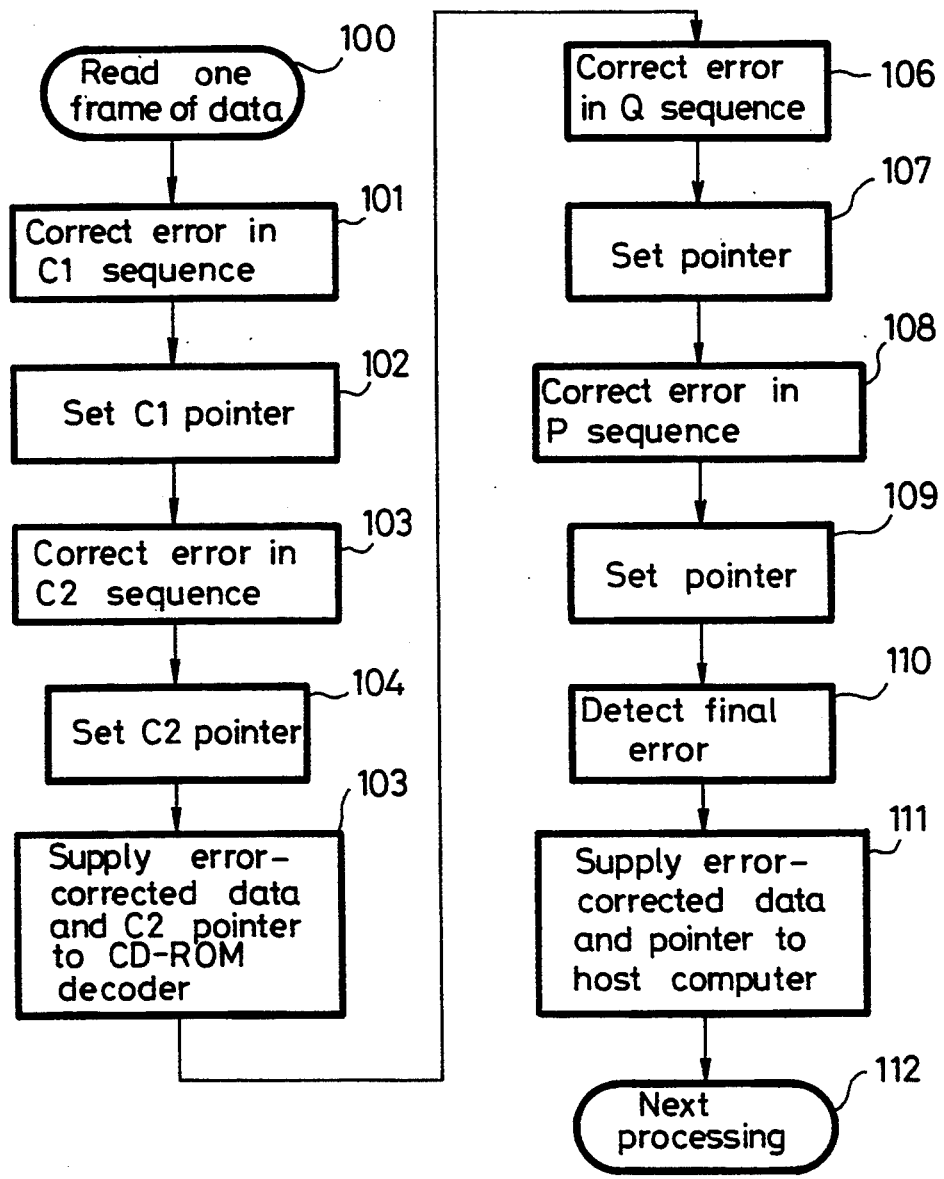
FIG. 4 is a flowchart of an overall sequence of error correction on the data stored in the conventional CD-ROM.

Playback operation of the reproducing system for CD-ROMs will be described in detail below. The operation, except the steps 106 through 109 shown in FIG. 4, is identical to that of the conventional reproducing system, and therefore only the process to be carried out by the CD-ROM decoder 14, which process corresponds to the steps 106 through 109 shown in FIG. 4, will be described below. The CD-ROM decoder 14 processes the intermediate data DA supplied from the CD decoder 12 one block (corresponding to 98 frames of CD data) at a time for successive Q- and P-sequence error correction. The Q sequence is a Reed-Solomon code of (m=8, n=45, k=43, d=3), and the P sequence is a Reed-Solomon code of (m=8, n=26, k=24, n=3). For error correction, the P and Q sequences require 2-word syndromes, respectively. In order to calculate these syndromes, it is necessary to use the following check matrix H:

$$H = \begin{bmatrix} 1 & 1 & \cdots & 1 & 1 \\ \alpha^N & \alpha^{N-1} & \cdots & \alpha & 1 \end{bmatrix} \quad (1)$$

In the equation (1), N=25 for the P sequence, N=44 for the Q sequence. Indicated by $\alpha$ in the equation (1) is a primitive element of a polynomial G (x), given below, for the generation of a Galois field $GF(2^8)$.

$$G(x) = X^8 + X^4 + X^3 + X^2 + 1$$

Since the number of all data supplied at this time is (N+1), if it is assumed that these data are represented by wi (i=0, 1, ..., N), the 2-word syndromes S0, S1 can be calculated according to the following equation:

$$\begin{bmatrix} S0 \\ S1 \end{bmatrix} = H \begin{bmatrix} wN \\ wN-1 \\ \cdot \\ \cdot \\ \cdot \\ w1 \\ w0 \end{bmatrix} \quad (2)$$

The values of the 2-word syndromes depend on the number of error words, as follows:

(1) If there is no error, then S0=S1=0.

(2) If an error happens to one word, then the values of the 2-word syndromes are given as follows:

In the event that an error Ei happens to an ith word wi, for example, the following equations are satisfied:

$$S0 = Ei,$$

$$S1 = \alpha^i Ei \quad (3).$$

From these equations, i can be determined according to the following equation:

$$i = \log(S1/S0) \quad (4).$$

The equation (4) can easily be calculated using a ROM or the like as a conversion table. More specifically, when an error happens to one word only, the position i of the error and the value Ei of the error can be known from the 2-word syndromes, making it possible to detect and correct the error.

(3) If errors happen to two words, the values of the 2-words syndromes are given as follows:

In the event that errors Em, En happen respectively to 2-word data wm, wn (m≠n), the following equations are satisfied:

$$S0 = Em + En, \quad S1 = \alpha^m Em + \alpha^n En \quad (5).$$

Solving these equations (5) for Em, En, the errors Em, En are expressed as follows:

$$Em = S0 + En,$$

$$En = \frac{S1 + \alpha^m S0}{\alpha^m + \alpha^n}. \quad (6)$$

The equations (6) signify that the values Em, En of the errors can be calculated if the positions m, n of the errors are known. With respect to the Q-sequence error correction, for example, if the positions of the 2-word errors are known from the C2 pointer that has been determined by the error correction for the CD itself, then the 2-word errors can completely be corrected by the Q-sequence error correction.

If errors happen to more than 2 words and the positions of the errors cannot be identified, then the errors cannot be corrected and erasure correction occurs. Therefore, on the presumption that errors exist for the (N−1) data except the parity words, it is necessary to set a pointer to "1" for those data.

Figure 6A:
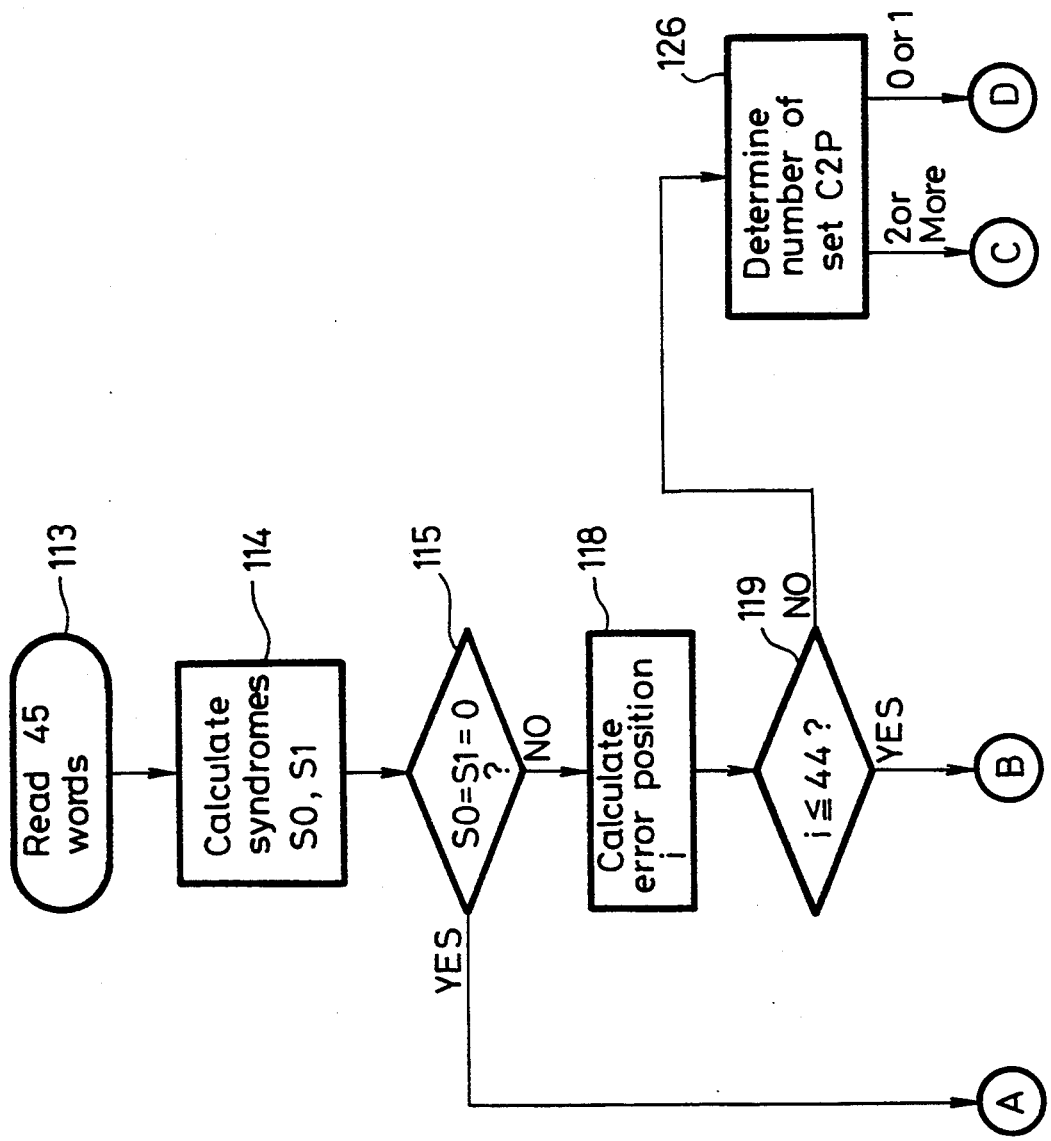
FIGS. 6A and 6B together are a flowchart of a sequence of Q-sequence error correction according to a first embodiment of the present invention, to be carried out by the reproducing system for CD-ROMs.
Figure 6B:
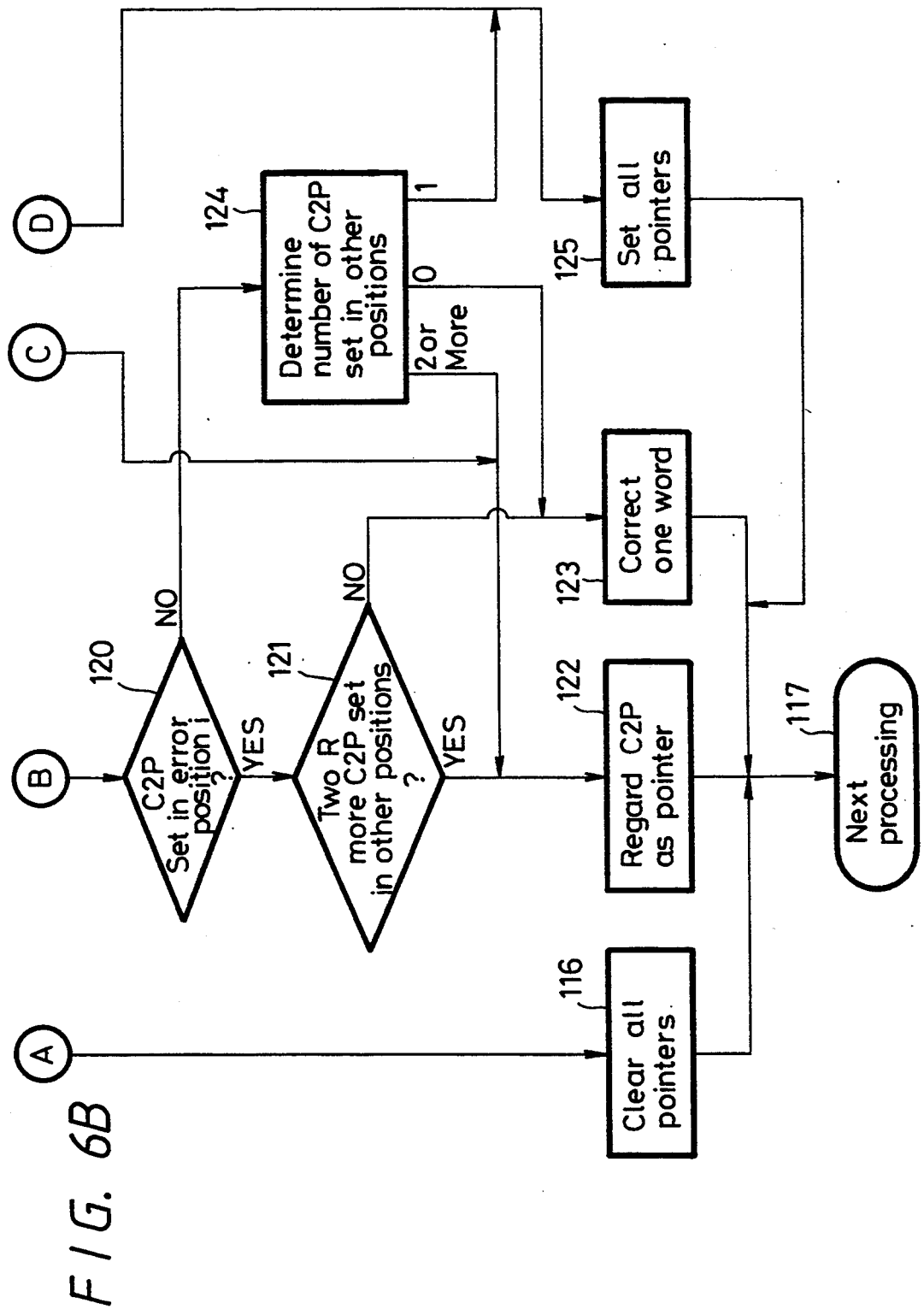

A method of Q-sequence error correction according to a first embodiment of the present invention, using the CD-ROM decoder 14 shown in FIG. 5, will be described below with reference to FIGS. 6A and 6B. The method of Q-sequence error correction corresponds to the steps 106, 107 shown in FIG. 4. According to the method of Q-sequence error correction, the data of 45 words that have been inputted and C2 pointers of 45 bits are processed to generate the data of 43 words to be outputted and output pointers of 43 bits indicative of whether the respective data are correct or not. Each of the bits of the C2 pointers and the output pointers is of a low level of "0"0 when the corresponding data word is presumed to be corrected, and of a high level of "1" when the corresponding data word is presumed to be in error.

Figure 2:
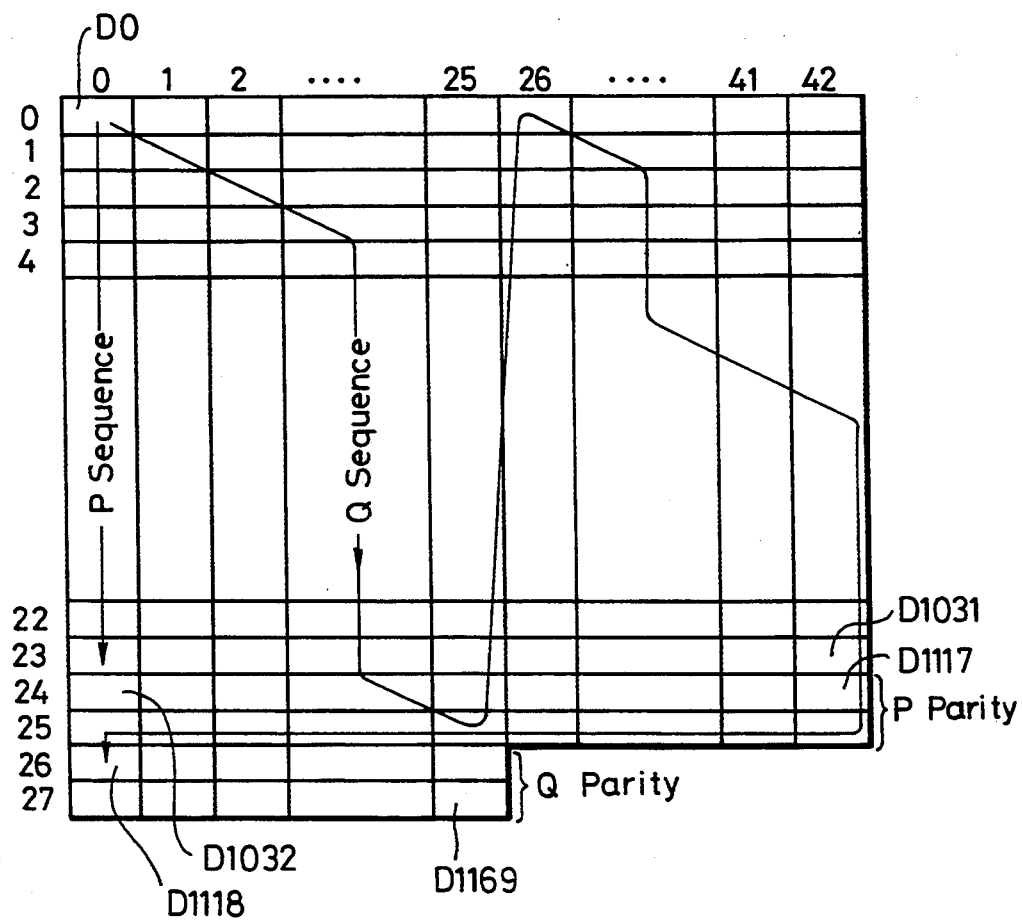
FIG. 2 is a diagram illustrative of a product code of the conventional CD-ROM.
Figure 3:
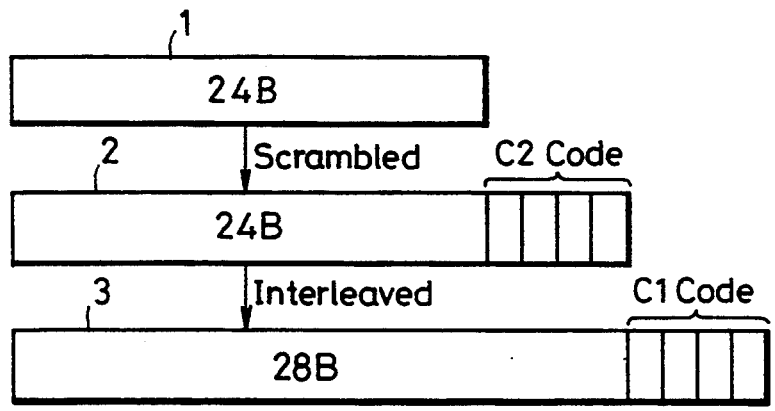
FIG. 3 is a diagram illustrative of the product code of the conventional CD-ROM.

The data of 45 words shown in FIG. 2, which is a Q-sequence correction unit, is read in a step 113. At the same time, C2 pointers of 45 bits are also read.

2-word syndromes S0, S1 are calculated according to the equation (2) (N=44) in a step 114.

Then, a step 115 determines whether both of the 2-word syndromes S0, S1 are zero or not. If both syndromes are zero, then operation of the CD-ROM decoder 14 goes to a step 116, and if not, operation of the CD-ROM decoder 14 goes to a step 118.

In the step 116, since all data are presumed to be correct if both syndromes are zero, all output pointers of 43 bits (2 bits for parity words are not necessary) indicative of whether the respective data are correct or not are set to a low level of "0". Then, control proceeds to a step 117.

In the step 117, the data of 43 words except the parity words and the corresponding output pointers of 43 bits are written in a memory for P-sequence error correction, and the data of next 45 words and C2 pointers are read.

Using the 2-word syndromes, the error position i is calculated according to the equation (4) in a step 118. If exactly one out of the 45 words is in error, then the error position i is an integer in the range of 0≦i≦44. If two or more words are in error, then the error position i is of a value of 45 or more, or of a value of 44 or less that is different from the actual error position. However, the error position i may be in conformity with one of the positions of the two or more errors.

A step 119 then determines whether or not the error position i is 44 or less. If the error position i is 44 or less, then control proceeds to a step 120, and if the error position i is 45 or more, then control goes to a step 126.

The step 120 determines whether a C2 pointer C2P is set for the word in the calculated error position i, i.e., whether the C2 pointer corresponding to the word in the error position i is "1" or not. If the C2 pointer is set, then control proceeds to a step 121, and if the C2 pointer is not set, then control goes to a step 124.

The step 121 determines whether two or more C2 pointers C2P are set in other positions than the error position i.

If two or more C2 pointers C2P are set in other positions than the error position i, then the C2 pointers are considered correct. Since there are three or more words are in error including the error position i, no error correction can be effected in the Q sequence. Therefore, no error correction is effected, and the C2 pointers are reproduced as output pointers in a step 122. Then control goes to the step 117.

If only up to one C2 pointer is set in other positions than the error position i, then the error is regarded as existing in the error position i only. Stated otherwise, if the C2 pointer is not set in other positions than the error position i, then the error apparently exists only with the word in the error position i. If only one C2 pointer is set in other positions than the error position i, then since the error position i is determined according to the equation (4), it is appropriate to regard the C2 pointer set in other positions than the error position i, as being wrong. Consequently, the value $E_i$ of the 1-word error in the error position i is determined according to the equations (3). Using the determined value of the error, the error in the error position i is corrected, and then all output pointers are set to "0" in a step 123. Thereafter, control goes to the step 117.

If the C2 pointer is not set in the error position i in the step 120, then the number of C2 pointers set in other positions is determined in the step 124. If no C2 pointer is set in other positions, then control goes to the step 123, and the word in the error position i is corrected. If two or more C2 pointers are set in other positions, then it is appropriate to regard the calculation of the error position i according to the equation (4) as being wrong due to the existence of two or more errors. In this case, the C2 pointers are regarded as being proper, and control goes to the step 122. In the step 122, no error correction is effected, and the C2 pointers are reproduced as output pointers.

If only two C2 pointers are set in other positions, then the 2-word errors can theoretically be determined according to the equations (6). However, inasmuch as P-sequence error correction will be carried out after the Q-sequence error correction, the 2-word errors are not corrected intentionally in the Q sequence in order to increase the error detection capability.

If the number of C2 pointers set in other positions than the error position i is one in the step 124, then the value indicated by the errors of the C2 pointers and the error position i according to the equation (4) are contradictory. Therefore, accurate error positions cannot be specified. Based on the assumption that all 43 words may possibly be in error, all output pointers corresponding to the 43 words are set to "1" in a step 125. Thereafter, operation of the CD-ROM decoder 14 goes to the step 117.

If the error position i is 45 or more in the step 119, then the number of C2 pointers that are set to "1" is checked in a step 126. Since the error position i which is 45 or more indicates that there are two or more error words, if the number of C2 pointers that are set to "1" is two or more, then these C2 pointers can be regarded as being proper. In this case, control goes to the step 122 in which the C2 pointers are reproduced as output pointers. If the number of C2 pointers that are set to "1" is one or less, since the value of the C2 pointers and the calculated error position i are contradictory, control goes to the step 125 in which all pointers are set.

The Q-sequence error correction is effected in the above steps 113 through 126.

Figure 7A:
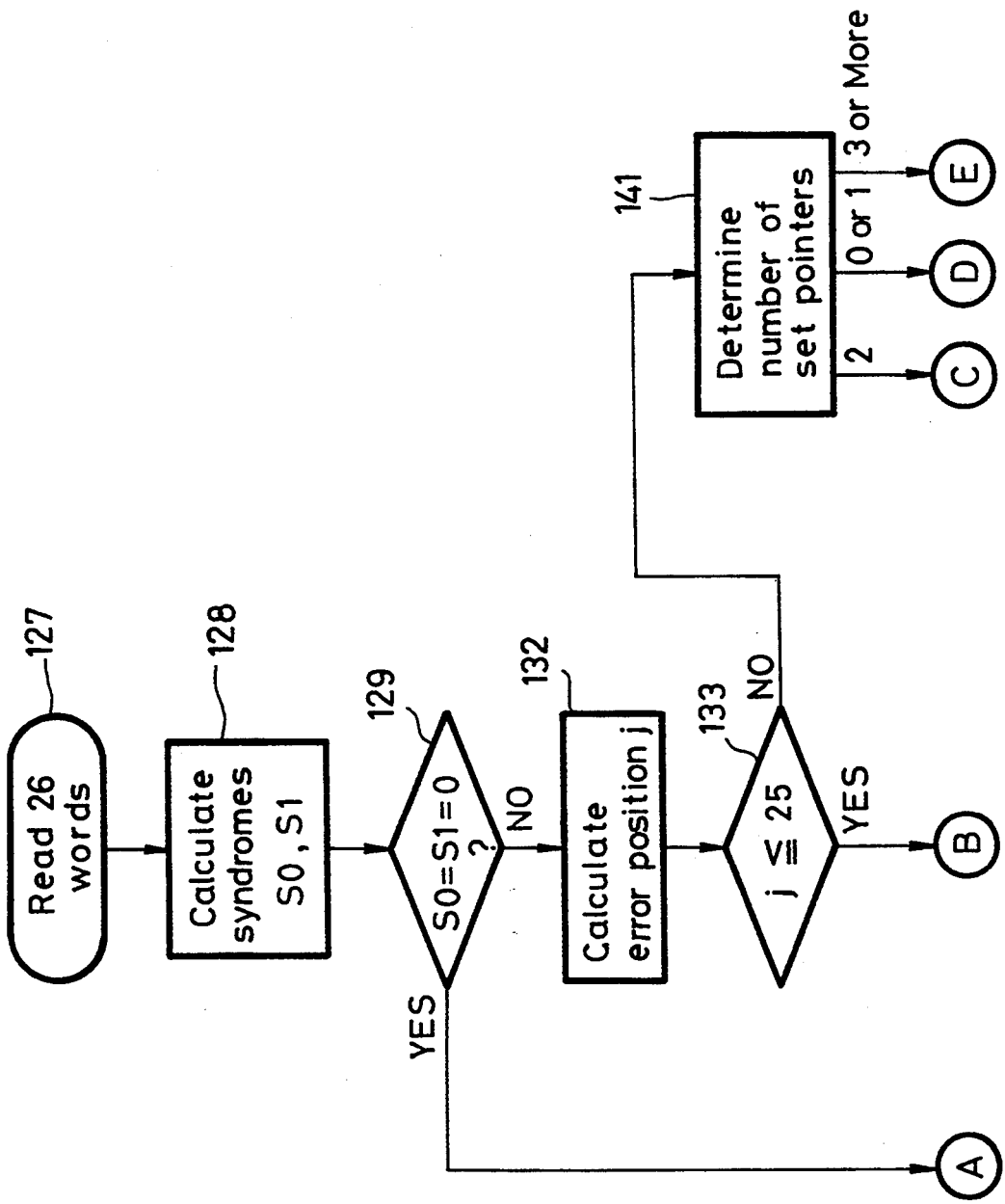
FIGS. 7A and 7B together are a flowchart of a sequence of P-sequence error correction according to a second embodiment of the present invention, to be carried out by the reproducing system for CD-ROMs.
Figure 7B:
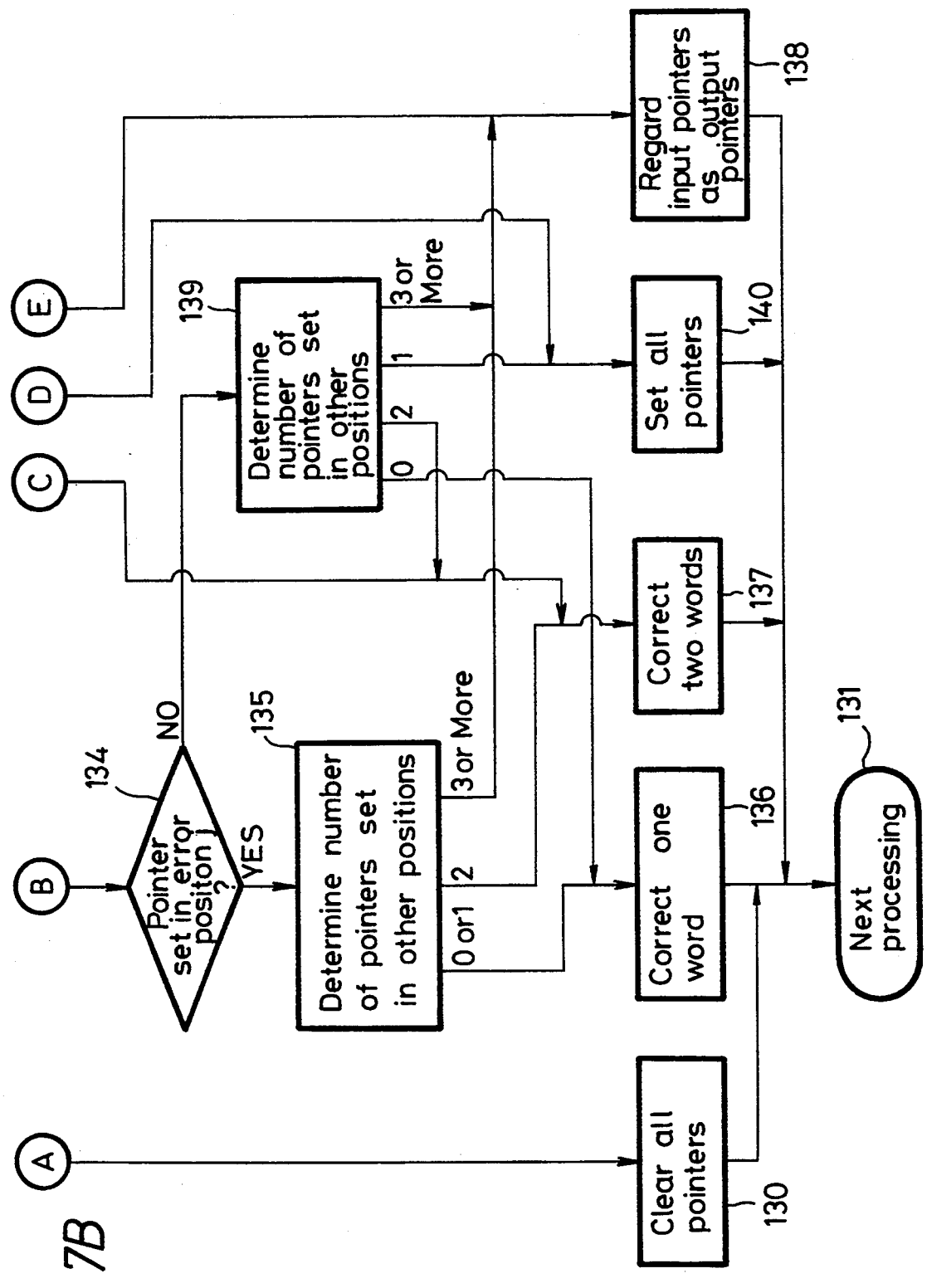

A method of P-sequence error correction according to a second embodiment of the present invention, using the CD-ROM decoder 14 shown in FIG. 5, will be described below with reference to FIGS. 7A and 7B. The method of P-sequence error correction corresponds to the steps 108, 109 shown in FIG. 4. According to the method of P-sequence error correction, the data of 26 words that have been inputted and pointers of 26 bits that have been added by the Q-sequence error correction are processed to generate data of 24 words to be outputted and output pointers of 24 bits indicative of whether the respective data are correct or not. Each of the bits of the supplied pointers and the output pointers is of a low level of "0" when the corresponding data word is presumed to be corrected, and of a high level of "1" when the corresponding data word is presumed to be in error.

The data of 26 words shown in FIG. 2, which is a P-sequence correction unit, is read in a step 127. At the same time, Q-sequence pointers of 26 bits are also read. 2-word syndromes $S_0$, $S_1$ are calculated according to the equation (2) (N=25) in a step 128.

Then, a step 129 determines whether both of the 2-word syndromes $S_0$, $S_1$ are zero or not. If both syndromes are zero, then operation of the CD-ROM decoder 14 goes to a step 130, and if not, operation of the CD-ROM decoder 14 goes to a step 132.

In the step 130, since all data are presumed to be correct if both syndromes are zero, all output pointers of 24 bits (2 bits for parity words are not necessary) indicative of whether the respective data are correct or not are set to a low level of "0". Then, control proceeds to a step 131.

In the step 131, the data of 24 words except the parity words and the corresponding output pointers of 24 bits are written in a memory for Q-sequence error correction, and the data of next 26 words and pointers are read.

Using the 2-word syndromes, the error position j is calculated according to the equation (4) in a step 132. If exactly one out of the 26 words is in error, then the error position j is an integer in the range of $0 \leq i \leq 25$. If two or more words are in error, then the error position j is of a value of 26 or more, or of a value of 25 or less that is different from the actual error position. However, the error position j may be in conformity with one of the positions of the two or more errors.

A step 133 then determines whether or not the error position j is 25 or less. If the error position j is 25 or less, then control proceeds to a step 134, and if the error position i is 26 or more, then control goes to a step 141.

The step 134 determines whether a Q-sequence pointer is set for the word in the calculated error position j, i.e., whether the pointer corresponding to the word in the error position j is 37 1" or not. If the pointer is set, then control proceeds to a step 135, and if the pointer is not set, then control goes to a step 139.

The step 135 determines the number of words for which the Q-sequence point is set in other positions than the error position j. Control goes to different processes or flows depending on the number of Q-sequence pointers set in other positions than the error position j.

If only up to one pointer is set in other positions than the error position j, then the error is regarded as existing in the error position j only. Stated otherwise, if the pointer is not set in other positions than the error position j, then the error apparently exists only with the word in the error position j. If only one pointer is set in other positions than the error position j, then since the error position j is determined according to the equation (4), it is appropriate to regard the pointer set in other positions than the error position i, as being wrong. Consequently, the value $E_j$ of the 1-word error in the error position j is determined according to the equations (3). Using the determined value of the error, the error in the error position j is corrected, and then all output pointers are set to "0" in a step 135. Thereafter, control goes to the step 131.

If pointers are set with 2 words in other positions than the error position j in the step 135, then the words in other positions than the error position j are regarded as being in error. That is, the wrong error position J is regarded as being calculated according to the equation (4) due to the 2-word errors in other positions than the error position j. In the case where the accurate positions of the 2-word errors are known, the values of the 2-word errors can accurately be calculated according to the equations (6), and the 2-word errors can accurately be corrected using the calculated values. The errors with the 2 words for which the pointers are set in other position than the error position j are corrected, and all output pointers are set to "0" in a step 137. Thereafter, control goes to the step 131.

If three or more Q-sequence pointers are set in other positions than the error position j, then the Q-sequence pointers are considered correct. Since there are three or more words are in error including the error position j, no error correction can be effected in the P sequence. Therefore, no error correction is effected, and the pointers inputted from the Q sequence are reproduced as output pointers in a step 138. Then, control goes to the step 131.

If the Q-sequence pointer is not set in the error position j in the step 134, then the number of pointers set in other positions is determined in the step 139. If no pointer is set in other positions, then control goes to the step 136, and the word in the error position j is corrected. If two pointers are set in other positions, then it is appropriate to regard the calculation of the error position j according to the equation (4) as being wrong due to the existence of two errors. In this case, the Q-sequence pointers are regarded as being proper, and control goes to the step 137. In the step 137, the errors with the 2 words indicated by the Q-sequence pointers are corrected. If three or more pointers are set in other positions, then control goes to the step 138 in which the pointers are reproduced as output pointers.

While the 2-word errors are not corrected in the Q sequence, the 2-word errors are corrected in the P sequence because more importance is attached to the error correction capability than to the error detection capability in the Q sequence.

If the number of Q-sequence pointers set in other positions than the error position j is one in the step 139, then the value indicated by the errors of the pointers and the error position j according to the equation (4) are contradictory. Therefore, accurate error positions cannot be specified. Based on the assumption that all 24 words may possibly be in error, all output pointers corresponding to the 24 words are set to 37 1" in a step 140. Thereafter, operation of the CD-ROM decoder 14 goes to the step 131.

If the error position j is 26 or more in the step 133, then the number of Q-sequence pointers that are set to 37 1" is checked in a step 141. Since the error position j which is 26 or more indicates that there are two or more error words, if the number of pointers that are set to "1" is two or more, then these pointers can be regarded as being proper. In this case, control goes to the step 137 in which the 2-word errors indicated by the pointers are corrected. If the number of pointers that are set to "1" is three or more, then since no error correction can be carried out, control goes to the step 138 in which the pointers are reproduced as output pointers. If the number of pointers that are set to "1" is one or less, then since the value of the pointers and the calculated error position j are contradictory, control goes to the step 140 in which all pointers are set.

The P-sequence error correction is effected in the above steps 127 through 141.

In the above embodiments, since the error detection capability is increased in the Q sequence, and the error correction capability is increased in the P sequence, the probability of erroneous correction and the probability of correction failures can be lowered as a whole. The calculations required in the Q and P sequences are as complex as the equation (4). Since the calculation according to the equation (4) can easily be achieved by a ROM table or the like, the error correction can be executed at high speed on a real-time basis.

The error correction method according to the present invention may also be incorporated in a digital signal recording and reproducing system which employs a magnetic tape as a recording medium.

The present invention is advantageous in that errors can be corrected at high speed simply by relatively easy calculations to determine a single error position i or j and comparing the error position i or j with a position in which an input pointer is set. The present invention is also advantageous in that the probability of erroneous correction and the probability of correction failures can be lowered because different processes or flows are followed depending on the number of words for which input pointers are set.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A method for effecting error correction on (N−2) words of data, where N is an integer of at least 3, using a 2-word parity code added to the data and input pointers that have been set with respect to the data presumed to be subjected to an error, and for generating output pointers to be set with respect to words of data which are presumed to not be completely error-corrected, said method comprising the steps of:

determining 2-word syndromes from the (N−2) words of data and the 2-word parity code, and calculating a single error position i from said 2-word syndromes;

if the error position i is no more than (N−1) and one of the input pointers is set in the error position i, reproducing the input pointers as the output pointers when at least two of the input pointers are set in positions other than the error position i, and correcting the (N−2) word in the error position i when not more than one of the input pointers is set in a position other than the error position i;

if the error position i is no more than (N−1) and one of the input pointers is not set in the error position i, reproducing the input pointers as the output pointers when at least two of the input pointers are set in positions other than the error position i, setting the output pointers with respect to all the data when only one of the input pointers is set in a position other than the error position i, and correcting the (N−2) word in the error position i when no input pointer is in a position other than the error position i; and if the error position i is at least N, reproducing the input pointers as the output pointers when at least two of the input pointers are set, and setting the output pointers with respect to all the data when not more than one input pointer is set.

2. The method of claim 1 wherein the 2-word syndromes are designated S0 and S1, and are calculated according to:

$$\begin{bmatrix} S0 \\ S1 \end{bmatrix} = H \begin{bmatrix} wN \\ wN-1 \\ \vdots \\ w1 \\ w0 \end{bmatrix}$$

where, $$H = \begin{bmatrix} 1 & 1 & \ldots & 1 & 1 \\ \alpha^N & \alpha^{N-1} & \ldots & \alpha & 1 \end{bmatrix},$$

where, $\alpha$ is a primitive element of a polynomial G(x), $G(x)=X^8+X^4+X^3+X^2+1$, and w is a word of data.

3. The method of claim 1, wherein the error position i, for a single error Ei which occurs in an ith word wi, is calculated according to:

$i = \log(S1/S0)$, where, $S0=Ei$, and $S1=\alpha^i Ei$, where, $\alpha$ is a primitive element of a polynomial G(x), and $G(x)=X^8+X^4+X^3+X^2+1$.

4. The method of claim 1, wherein the error position i is a first error position Em, and En is a second error position, where m is not equal to n, and the first and second error position are calculated according to:

$Em = S0 + En$, $En = (S1+\alpha^m S0)\alpha^m + \alpha^n)$, where, $S0 = Em + En$, and $S1 = \alpha^m Em + \alpha^n En$, where, $\alpha$ is a primitive element of a polynomial G(x), and $G(x)=X^8+X^4+X^3+X^2+1$.

5. The method of claim 1, further comprising the step of:

supplying the corrected (N−2) words of data to a host computer via an interface circuit.

6. A method for effecting error correction on (M−2) words of data, where M is an integer of at least 3, using a 2-word parity code added to the data and input pointers that have been set with respect to the data presumed to be subjected to an error, and for generating output pointers to be set with respect to words of data which are presumed to not be completely error-corrected, said method comprising the steps of:

determining 2-word syndromes from the (M−2) words of data and the 2-word parity code, and calculating a single error position j from said 2-word syndromes;

if the error position j is not more than (M−1) and one of the input pointers is set in the error position j, reproducing the input pointers as the output pointers when at least three of the input pointers are set in positions other than the error position j, correcting those (M−2) two words for which the input pointers are set when the input pointers are set in positions other than the error position j, and correcting that one (M−2) word in the error position when not more than one input pointer is set in a position other than the error position j;

if the error position j is (M−1) or less and the input pointer is not set in the error position j, reproducing the input pointers as the output pointers when the input pointers are set in positions other than the error position j, correcting two words for which the input pointers are set when the input pointers are set in positions other than the error position j, setting the output pointers with respect to all the data when only one input pointer is set in position other than the error position j, and correcting that one (M−2) word in the error position when the input pointer is not set in a position other than the error position j; and if the error position is at least M, reproducing the input pointers as the output pointers when at least three input pointers are set, correcting two words for which the input pointers are set when at least two input pointers are set, and setting the output pointers with respect to all the data when not more than one input pointer is set.

7. The method of claim 6 wherein the 2-word syndromes are designated S0 and S1, and are calculated according to:

$$\begin{bmatrix} S0 \\ S1 \end{bmatrix} = H \begin{bmatrix} wM \\ wM-1 \\ \vdots \\ w1 \\ w0 \end{bmatrix}$$

where $$H = \begin{bmatrix} 1 & 1 & \ldots & 1 & 1 \\ \alpha^M & \alpha^{M-1} & \ldots & \alpha & 1 \end{bmatrix},$$

$\alpha$ is a primitive element of a polynomial G(x), $G(x)=X^8+X^4+X^3+X^2+1$, and w is a word of data.

8. The method of claim 6, wherein the error position j, for a single error Ej which occurs in an jth word wj, is calculated according to:

$j = \log(S1/S0)$, where, $S0 = Ej$, and $S1 = \alpha^j Ej$, where, $\alpha$ is a primitive element of a polynomial G(x), and $G(x)=X^8+X^4+X^3+X^2+1$.

9. The method of claim 6, wherein the error position j is a first error position Em, and En is a second error position, where m is not equal to n, and the first and second error position are calculated according to:

$Em = S0 + En$, $En = (S1+\alpha^m S0)/(\alpha^m+\alpha^n)$, where, $S0 = Em + En$, and $S1 = \alpha^m Em + \alpha^n En$, where, $\alpha$ is a primitive element of a polynomial G(x), and $G(x)=X^8+X^4+X^3+X^2+1$.

10. The method of claim 6, further comprising the step of:

supplying the corrected (M−2) words of data to a host computer via an interface circuit.

* * * * *

UNITED STATES PATENT AND TRADEMARK OFFICE
CERTIFICATE OF CORRECTION

PATENT NO. : 5,408,477

DATED : April 18, 1995

INVENTOR(S) : TAKASHI OKADA
KAZUHIRO YASUDA
KAZUTOSHI SHIMIZUME

It is certified that error appears in the above-indentified patent and that said Letters Patent is hereby corrected as shown below:

In Column 8, line 16, please replace "of "O"O when" with --of "O" when--.

Signed and Sealed this

Twenty-seventh Day of June, 1995

Attest:

BRUCE LEHMAN

Attesting Officer          Commissioner of Patents and Trademarks